United States Patent [19]

Kotani

[11] Patent Number: 4,755,903
[45] Date of Patent: Jul. 5, 1988

[54] DISTANCE MEASURING RELAY FOR LINE FAULTS

[75] Inventor: Genzaburou Kotani, Hyogo, Japan

[73] Assignee: Mitsubishi Denki Kabushiki Kaisha, Tokyo, Japan

[21] Appl. No.: 28,076

[22] Filed: Mar. 20, 1987

Related U.S. Application Data

[63] Continuation of Ser. No. 676,304, Nov. 29, 1984, abandoned.

[30] Foreign Application Priority Data

Feb. 28, 1984 [JP] Japan .................. 59-35292

[51] Int. Cl.$^4$ ............................................. H02H 3/18
[52] U.S. Cl. ........................................ 361/80; 361/82
[58] Field of Search .......................... 361/80, 82, 84; 323/509, 522–525

[56] References Cited

U.S. PATENT DOCUMENTS

| | | | |
|---|---|---|---|
| 3,405,320 | 10/1968 | Schwanenflugel | 361/82 X |
| 3,599,044 | 8/1971 | Takemura | 361/82 |
| 3,732,464 | 5/1973 | Miki et al. | 361/80 |
| 3,800,215 | 3/1974 | Sovillard | 361/80 |
| 4,130,851 | 12/1978 | Perez-Cavero | 361/82 |
| 4,306,266 | 12/1981 | Born et al. | 361/80 |
| 4,308,565 | 12/1981 | de Mesmaeker et al. | 361/80 |
| 4,313,169 | 1/1982 | Takagi et al. | 361/80 |
| 4,357,666 | 11/1982 | Matsushima et al. | 361/80 X |
| 4,371,947 | 2/1983 | Fujisawa | 361/80 X |
| 4,405,966 | 9/1983 | Cavero | 361/80 |
| 4,438,475 | 3/1984 | Haley | 361/84 X |
| 4,453,191 | 6/1984 | Wilkinson | 361/84 |
| 4,570,231 | 2/1986 | Bunch | 361/80 X |
| 4,577,254 | 3/1986 | Yamaura | 361/80 |

FOREIGN PATENT DOCUMENTS

| | | |
|---|---|---|
| 0106790 | 6/1983 | European Pat. Off. . |
| 2932929 | 5/1980 | Fed. Rep. of Germany . |
| 2036478 | 6/1980 | United Kingdom . |

OTHER PUBLICATIONS

"Protective Relays" by A. R. van C. Warrington, pp. 270–274 (1969).
"Applied Protective Relaying", Westinghouse Electric Corporation, pp. 10-34, 10-42, 10-43 and 10-44 (1976).

Primary Examiner—M. H. Paschall
Assistant Examiner—A. Jonathan Wysocki
Attorney, Agent, or Firm—Bernard, Rothwell & Brown

[57] ABSTRACT

In a short-circuit distance relay for protecting a single-channel power transmission system with power supplies installed at two ends thereof, when there exists any resistance at a fault point on the power transmission line, an error is induced in measurement of the distance up to the fault point by a voltage drop component flowing through the fault-point resistance from the remote-end power supply. In order to eliminate such error in measuring the distance, the relay of this invention computes the impedance up to the fault point from the information including a positive-phase voltage and a positive-phase current in a normal state of the power transmission system, and also a positive-phase voltage, a positive-phase current and a negative-phase current in a faulty state of the system, whereby the fault-point resistance is rendered unconcerned with the distance to consequently avert the measurement error.

1 Claim, 3 Drawing Sheets

DISTANCE MEASURING RELAY FOR LINE FAULTS

This is a continuation of application Ser. No. 676,304 filed Nov. 29, 1984, now abandoned.

BACKGROUND OF THE INVENTION

1. Field of the Invention

The present invention relates to a short-circuit distance relay for protecting a single-channel power transmission system with power supplies installed at two ends thereof, and more particularly to an improved distance relay which is capable of eliminating a distance measurement error induced by a voltage drop component flowing through a fault-point resistance from the remote-end power supply.

2. Description of the Prior Art

In the conventional short-circuit distance relays of this type known heretofore, there have been existent some technical problems as described in "Handbook of Protective Relays" (Ohm CO., Ltd., 2nd edition, 2nd printing, April 25, 1970, pp. 111–112); "Protective Relay Technology" (Denki Shoin, 1st edition, 1st printing, Oct. 15, 1972, pp. 323–324); "Protective Relays" (A. R. van C. Warrington, John Wiley & Sons, New York, 1st edition, 1969, pp. 270–274); and "Applied Protective Relaying" (Westinghouse Electric Corp., Copyright 1976, pp. 10-34, 10-42, 10-43 & 10-44). In the present stage of development, however, such problems have not been solved yet. An exemplary conventional apparatus will now be described below.

FIG. 1 is a block diagram of a single-channel power transmission system with power supplies installed at two ends thereof, wherein there are shown a local-end power supply 1, a voltage transformer 2, a bus 3, a voltage transformer 4, a current transformer 5, a short-circuit distance relay 6, a power transmission line 7, a fault point 8, a bus 9, a voltage transformer 10, and a remote-end power supply 11.

FIG. 2 is an equivalent circuit diagram representing occurrence of a two-line short-circuit fault at the point 8 in FIG. 1. In the figure, there are shown a fault-phase supply voltage EAP at the local end (P), a fault-phase supply voltage EAQ at the remote end (Q), an impedance ZgP behind the local end, an impedance ZgQ behind the remote end, an impedance Z per unit length (km) of the power transmission line, a distance X (km) from the short-circuit distance relay to the fault point, an entire length L of the power transmission line, a fault-point resistance RF, a voltage VR at the location of the short-circuit distance relay, a fault current IP flowing through the fault point from the local-end power supply, and a fault current IQ flowing through the fault point from the remote-end power supply.

In FIG. 2, the voltage VR at the location of the short-circuit distance relay 6 is given by Eq. (1) below.

$$VR = XZ \cdot IP + RF \cdot (IP + IQ) \tag{1}$$

On the basis of the current IP flowing in the short-circuit distance relay 6, the impedance measured by the relay 6 is obtained through division of the voltage VR, which is applied to the relay 6, by the current IP as follows.

$$VR/IP = XZ + RF \cdot (1 + IQ/IP) \tag{2}$$

When the fault-point resistance RF is zero in Eq. (2), the impedance to be measured is obtainable as XZ in which Z represents the impedance per unit length of the transmission line 7, so that it is possible to measure the distance from the location of the short-circuit distance relay 6 to the fault point 8. Also in case the fault-point resistance RF has a finite value instead of being zero, the above distance is measurable from the sinusoidal component of the voltage VR relative to the fault current IP if an in-phase relationship is existent without any phase difference between the fault current IP from the local-end power supply 1 and the fault current IQ from the remote-end power supply despite a variation of the second-term resistance component in Eq. (2). This is obvious as the reactance component of XZ remains unchanged.

FIG. 3 graphically shows an exemplary case with occurrence of a fault in a conventional short-circuit distance relay 6, wherein R-jx coordinates represent a vector obtained when the fault current IQ from the remote terminal has a phase lag in comparison with the fault current IP at the local end.

In the graph of FIG. 3, there are plotted a voltage drop XZIP (segment OB) up to the fault point 8 (in FIG. 1) on the power transmission line 7 (in FIG. 1); a voltage drop RFIP (segment BC) caused across the fault-point resistance RF by the local-end current; a voltage drop RFIQ (segment CD) caused across the fault-point resistance RF by the remote-end current; an impedance angle α of the power transmission line; a phase difference angle θ between the voltage VR and the current IP at the relay location; and a phase difference angle δ between the local-end current IP and the remote-end current IQ.

In the conventional short-circuit distance relay having the above-mentioned constitution, the voltage VR at the relay location is represented by a segment OD of FIG. 3 from Eq. (1) when there exists a phase difference angle between the local-end current and the remote-end current, so that the reactance component obtained from the voltage VR and the local-end current IP is erroneously equal to the reactance value of a fault at a point A when the fault-point resistance RF is zero, whereby the point A varies depending on the fault-point resistance RF, the ratio between the local-end current IP and the remote-end current IQ, and also on the phase difference angle δ between the local-end current IP and the remote-end current IQ. Thus, it has been unavoidable heretofore that an error is induced in measuring the distance up to the fault point.

SUMMARY OF THE INVENTION

The present invention has been accomplished in view of the afore-mentioned disadvantages observed in the prior art. And its object resides in providing an improved short-circuit distance relay which is capable of eliminating an error in measurement of the distance from the information including a positive-phase voltage and a positive-phase current in a normal state of a power transmission system, and also a positive-phase voltage, a positive-phase current and a negative-phase current in a faulty state of the system.

An exemplary embodiment of the present invention comprises a plurality of means for deriving a positive-phase voltage V and a positive-phase current IL in a normal state of a power transmission system, and also a positive-phase voltage VF, a positive-phase current IF and a negative-phase current I2 in a faulty state of the system; a first arithmetic circuit for computing $I2 \cdot (VF - V)$ from the V, VF and I2 outputs of the deriving means, a second arithmetic circuit for computing $I2 \cdot (IF - IL) \cdot (ZP + ZQ)$ from the IL, IF and I2 outputs of the deriving means and a positive-phase impedance $(ZP + ZQ)$ of the system, a third arithmetic circuit for computing $(IF - IL)^2 \cdot (LZ2 + ZQ2)$ from the IL and IF outputs of the deriving means and a negative-phase impedance $(LZ2 + ZQ2)$ in the direction toward the remote end as viewed from the relay location, and a fourth arithmetic circuit for computing $(IF - IL) \cdot (I2 - IF + IL)$ from the IL, IF and I2 outputs of the deriving means; and means for calculating the impedance corresponding to the distance from the distance relay to the fault point from the outputs of the first, second, third and fourth arithmetic circuits, whereby a distance measurement is rendered independent of the fault point resistance RF and the phase difference between the local end current and the remote end current.

DESCRIPTION OF THE PREFERRED EMBODIMENTS

Hereinafter an exemplary embodiment of the present invention will be described with reference to the accompanying drawings.

Figure 1:
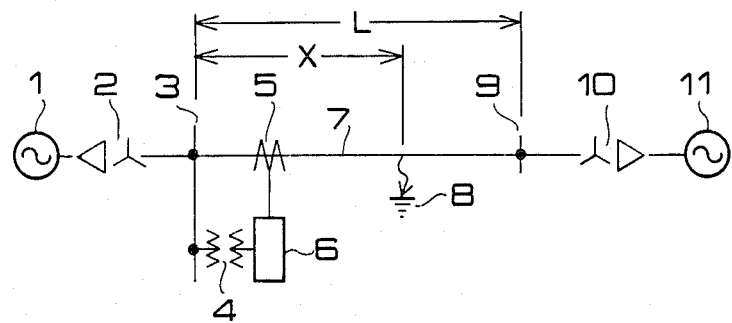
FIG. 1 is a block diagram of a prior art single-channel power transmission system with power supplies installed at two ends thereof.
Figure 2:
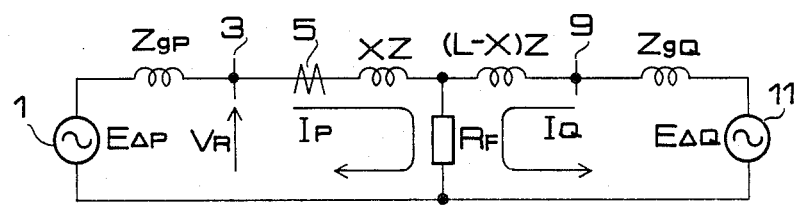
FIG. 2 is an equivalent circuit diagram in an exemplary case with occurrence of a two-line short-circuit fault in the prior art system of FIG. 1.
Figure 4:
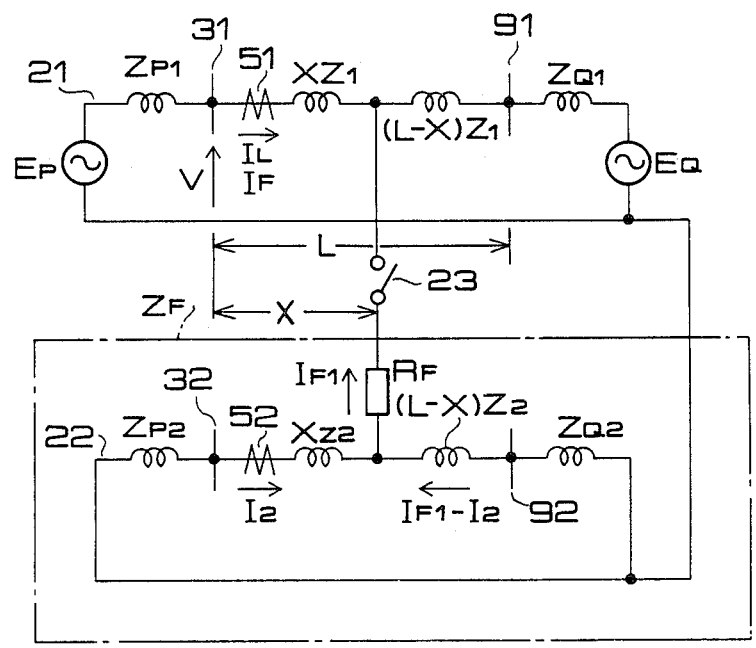
FIG. 4 is an equivalent circuit diagram showing symmetrical components at the occurrence of a two-line short-circuit fault in FIG. 1.
Figure 3:
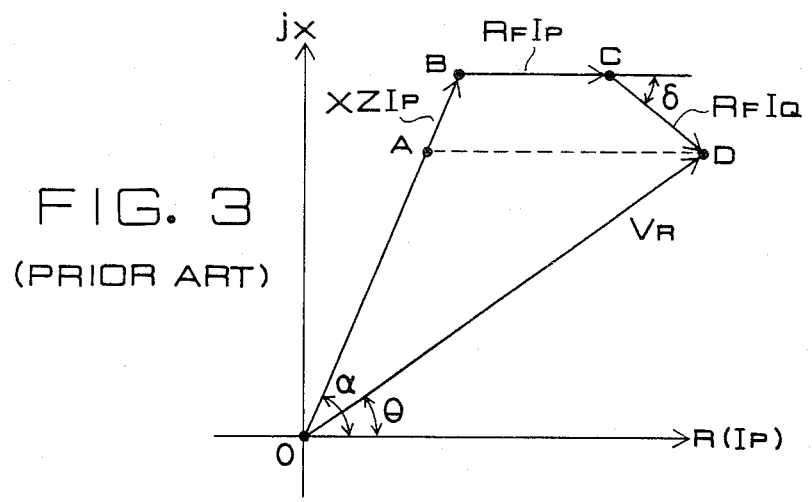
FIG. 3 is a vector diagram showing that a disadvantage is existent in a conventional prior art short-circuit distance relay.

In the circuit diagram of FIG. 4 showing symmetrical components at the occurrence of a two-line short-circuit fault at the point 8 in FIG. 1, there are included a positive-phase circuit 21, a negative-phase circuit 22, a switch 23 simulating a portion where a two-line short-circuit fault is induced, a positive-phase voltage deriving circuit 31 in the bus 3 of FIG. 1, a negative-phaes voltage deriving circuit 32 in the bus 3, current transformers 51 and 52 for deriving a positive-phase current and a negative-phase current at the position of the current transformer 5 shown in FIG. 1, a positive-phase voltage deriving circuit 91 in the remote end 9 of the bus of FIG. 1, and a negative-phase voltage deriving circuit 92 in the remote end 4 of the bus of FIG. 1. Further shown in FIG. 4 are a local-end supply voltage EP, a remote-end supply voltage EQ, a positive-phase impedance ZP1 behind the local end, a negative-phase impedance ZP2 behind the local end, a positive-phase impedance Z1 per unit length (km) of the power transmission line, a negative-phase impedance Z2 per unit length (km) of the power transmission line, a distance X (km) from the relay location to a fault point, an entire length L (km) of the power transmission line, a positive-phase impedance ZQ1 behind the remote end, a negative-phase impedance ZQ2 behind the remote end, a fault-point resistance RF, a positive-phase voltage V at the relay location in a normal state of the system, a positive-phase current IL flowing through the relay location in a normal state of the system (when the switch 23 is open), a negative-phase current I2 flowing through the relay location in a faulty state of the system (when the switch 23 is closed), a current IF1 flowing through the fault point, and a composite impedance ZF constituted of the negative-phase circuit impedance and the fault-point resistance.

Figure 5A:
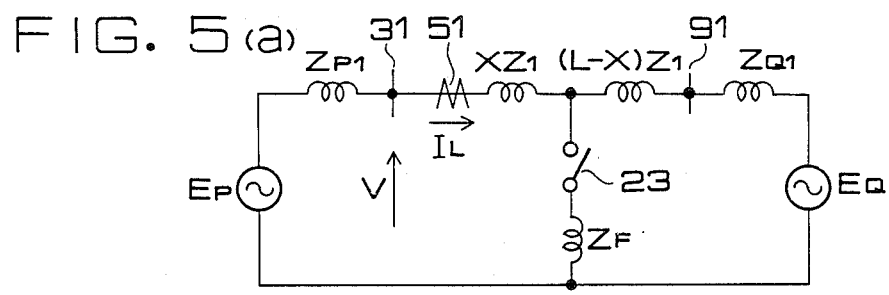
FIG. 5a is an equivalent circuit diagram showing a current distribution in the absence of a fault in FIG. 4.

In FIG. 5(a), ZF denotes a combination of the negative-phase circuit impedance and the fault-point resistance RF in FIG. 4, indicating that the system is in a normal state when the fault switch 23 is open. In such a normal state, a current IL flows in the current transformer 51 with a positive-phase voltage V being applied to the bus 31.

Figure 5B:
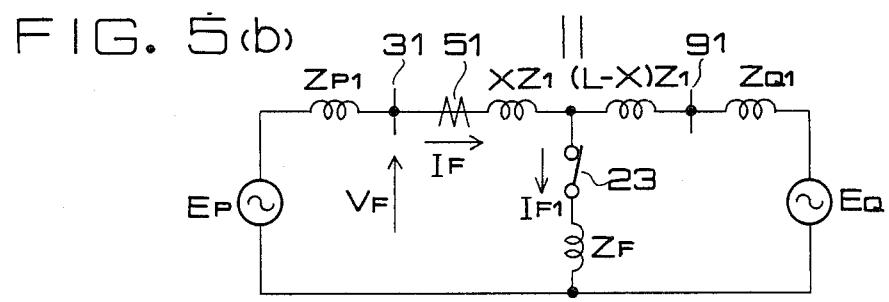
FIG. 5b is an equivalent circuit diagram showing a current distribution at the occurrence of a fault in FIG. 4.

FIG. 5(b) shows a faulty state of the system where the fault switch 23 is closed from its open position in FIG. 5(a). In such a faulty state, a current IF flows in the current transformer 51 with a positive-phase voltage VF being applied to the bus 31, and a fault current IF1 flows in the switch 23 simulating the fault point.

Figure 5C:
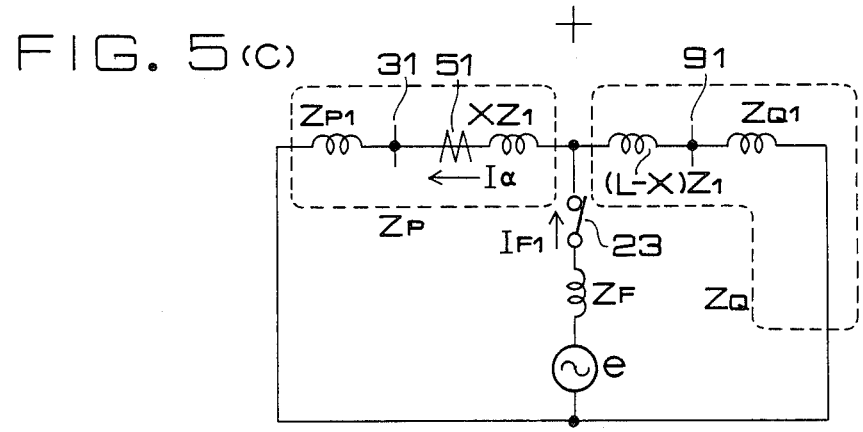
FIG. 5c is an equivalent circuit diagram showing currents which can be superimposed on FIG. 5b to cancel the fault current.

In FIG. 5(c), supply voltages EP and EQ at the two ends are removed, and an additional power supply e is provided at the fault point in such a manner that the current IF1 flowing through the fault point becomes opposite in polarity to that shown in FIG. 5(b).

Since the current flowing in the fault-point simulating switch 23 becomes zero as a result of mutual superposition of FIGS. 5(b) and 5(c), it follows that the configuration of FIG. 5(a) is achieved by superposing FIG. 5(c) on FIG. 5(b).

This is manifest from the Ho-Thevenin's theorem.

Due to the power supply e provided in the example of FIG. 5(c), a current $I\alpha$ comes to flow in the current transformer 51, so that $$IL = IF - I\alpha \tag{3}$$

The value of $I\alpha$ can be calculated as follows.

$$I\alpha = IF1 \cdot \frac{ZQ}{ZP + ZQ} \tag{4}$$

where $$ZP = ZP1 + XZ1$$

$$ZQ = (L-X) \cdot Z1 + ZQ1$$

According to FIG. 5(a), $$\frac{EP - EQ}{IL} = ZP + ZQ \tag{5}$$

Therefore, from Eqs. (3) through (5), $$ZQ = \frac{IF - IL}{IF1 \cdot IL} \cdot (EP - EQ) \tag{6}$$

Further according to FIG. 5(a), $$\frac{V - EQ}{IL} = XZ1 + ZQ \tag{7}$$

From Eqs. (6) and (7), $$XZ1 = \frac{V - EQ}{IL} - \frac{IF - IL}{IF1 \cdot IL} \cdot (EP - EQ) \tag{8}$$

The value of IF1 in Eq. (8) can be calculated in the manner described below. First, Eq. (9) is obtained according to the negative-phase circuit shown in FIG. 4.

$$0 = (ZP2 + XZ2) \cdot I2 - \{(L-X)Z2 + ZQ2\} \cdot (IF1 - I2) \tag{9}$$

Solving the above with respect to IF1, $$IF1 = \frac{ZP2 + LZ2 + ZQ2}{(L-X) \cdot Z2 + ZQ2} \cdot I2 \tag{10}$$

Substituting Eq. (10) in Eq. (8), $$XZ1 = \frac{V - EQ}{IL} - \tag{11}$$

$$\frac{(IF - IL) \cdot (EP - EQ) \cdot \{(L-X)Z2 + EQ2\}}{IL \cdot (ZP2 + LZ2 + ZQ2) \cdot I2}$$

Substituting Eq. (5) in Eq. (11), $$XZ1 = \frac{V - EQ}{IL} - \tag{12}$$

$$\frac{(IF - IL) \cdot (ZP + ZQ) \cdot \{(L-X)Z2 + EQ2\}}{(ZP2 + LZ2 + ZQ2) \cdot I2}$$

Rewriting Eq. (12) with respect to XZ1, $$XZ1 = \frac{ZT2 \cdot I2 \cdot (V - EQ) - (ZP + ZQ) \cdot (LZ2 + ZQ2) \cdot IL \cdot (IF - IL)}{ZT2 \cdot IL \cdot I2 - (ZP + ZQ) \cdot IL \cdot (IF - IL) \cdot Z2/Z1} \tag{13}$$

where $ZT2 = ZP2 + LZ2 + ZQ2$.

From Eq. (4), ZP+ZQ in Eq. (13) is equal to ZP1+LZ1+ZQ1, and the impedance of the positive-phase circuit is generally equal to that of the negative-phase circuit. Therefore, it is possible to rewrite the above as $ZP + ZQ = ZT2$ and $Z1 = Z2$, so that Eq. (13) can be simplified as $$XZ1 = \frac{(V - EQ) \cdot I2 - IL \cdot (IF - IL) \cdot (LZ2 + ZQ2)}{IL \cdot I2 - IL \cdot (IF - IL)} \tag{14}$$

where the entire values are known with the exception of the supply voltage EQ at the remote end.

The supply voltage EQ at the remote end can be calculated in the following manner. First, from the circuit of FIG. 5(a) in a normal state of the system, $$EP - V = ZP1 \cdot IL \tag{15}$$

Also from the circuit of FIG. 5(b) in a faulty state of the system, $$EP - VF = ZP1 \cdot IF \tag{16}$$

Accordingly, from Eqs. (15) and (16), $$EP = \frac{V \cdot IF - VF \cdot IL}{IF - IL} \tag{17}$$

Substituting EP in Eq. (17) in Eq. (5), $$EQ = \frac{V \cdot IF - VF \cdot IL}{IF - IL} - (ZP + ZQ) \cdot IL \tag{18}$$

The impedance up to the fault point is obtained from Eq. (19) by substituting Eq. (18) for Eq. (14).

$$XZ1 = \frac{\begin{array}{c} I2 \cdot (VF - V) + I2 \cdot (IF - IL) \cdot \\ (ZP + ZQ) - (IF - IL)^2 \cdot \\ (LZ2 + ZQ2) \end{array}}{(IF - IL) \cdot (I2 - IF + IL)}$$

Figure 6:
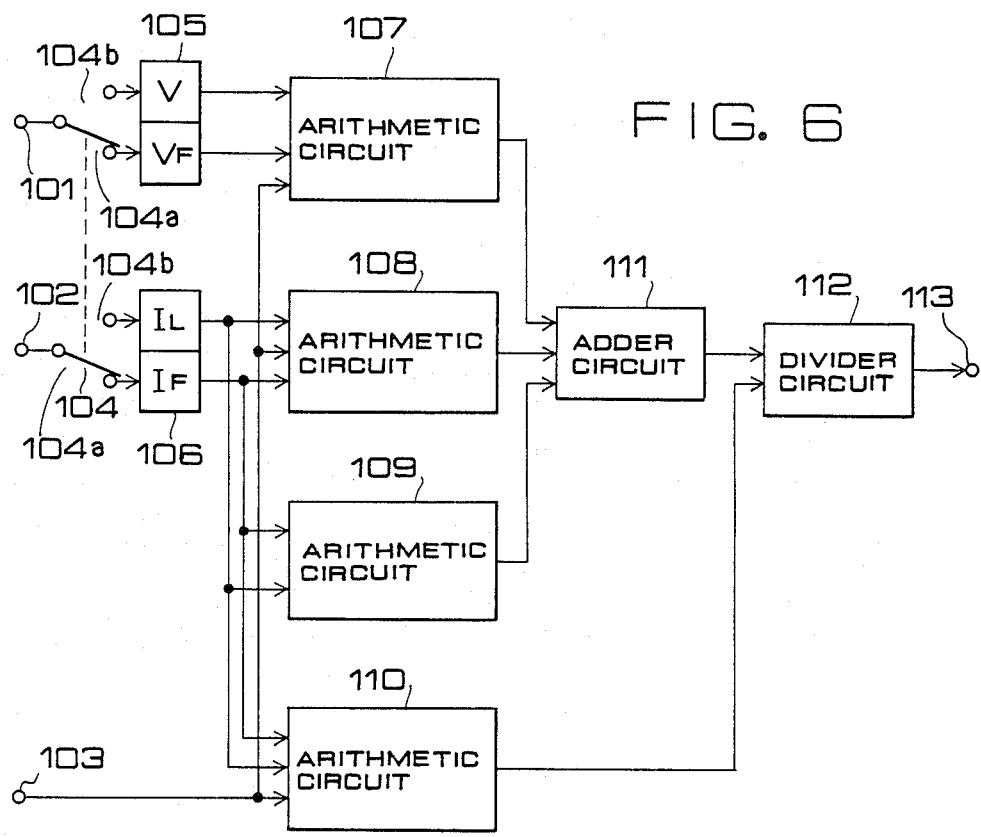
FIG. 6 is a circuit diagram of an exemplary short-circuit distance relay embodying the present invention.

FIG. 6 is a circuit diagram of an exemplary distance relay embodying the present invention, wherein there are shown an input terminal 101 for a positive-phase voltage component, an input terminal 102 for a positive-phase current component, an input terminal 103 for a negative-phase current component, a selector switch 104 actuated in response to the output of a fault detector (not shown), a first memory circuit 105, a second memory circut 106, arithmetic circuits 107–110, an adder circuit 111 and a divider circuit 112 (impedance calculating means), and an output terminal 113.

In the circuit configuration mentioned above, the relay performs the following operation.

The selector switch 104 responsive to the output of a fault detector (not shown) is so arranged that its lower contact 104a is connected in a faulty state of the power transmission system as illustrated in FIG. 6 and its upper contact 104b is connected in a normal state of the system. Consequently, in the memory circuit 105 are stored both the positive-phase voltage V applied via the input terminal 101 in a normal state of the system and the positive-phase voltage VF in a faulty state thereof.

In the memory circuit 106 are stored both the positive-phase current IL applied via the input terminal 102 in a normal state of the system and the positive-phase current IF in a faulty state thereof.

In the first arithmetic circuit 107, I2·(VD−V) is computed from the output of the memory circuit 105 and also from the negative-phase current component introduced via the input terminal 103. In the second arithmetic circuit 108, I2·(IF−IL)·(ZP+ZQ) is computed from the output of the memory circuit 106, the component introduced via the input terminal 103 and also from the sum of the predetermined positive impedances (ZP+ZQ) of the system. In the third arithmetic circuit 109, (IF−IL)²·(LZ2+ZQ2) is computed from the output of the memory circuit 106 and the sum of the predetermined negative-phase impedances (LZ2+ZQ2) in the direction toward the remote end as viewed from the relay location. And further in the fourth arithmetic circuit 110, (IF−IL) (I2−IF+IL) is computed from the output of the memory circuit 106 and the component introduced via the input terminal 103.

The adder circuit 111 executes a calculation by first adding the outputs of the arithmetic circuits 107 and 108 and then subtracting the output of the eighth arithmetic circuit 109 from the sum thus obtained. Subsequently, the divider circuit 112 in the next stage divides the output of the adder circuit 111 by the output of the fourth arithmetic circuit 110 to calculate the impedance of Eq. (19) up to the fault point and then provides the result at the output terminal 113.

As described hereinabove, according to the short-circuit distance relay of the present invention, the impedance up to the fault point is computed from the information including the positive-phase voltage V and the positive-phase current IL in a normal state of the power transmission system and also the positive-phase voltage VF, the positive-phase current IF and the negative-phase current I2 in a faulty state of the system, so that the fault-point resistance RF is rendered unconcerned with the impedance. Thus, it becomes possible to eliminate any error induced in the prior art during measurement of the distance by the voltage drop caused across the fault-point resistance RF due to the phase difference between the two power supplies at the system ends.

In order to simplify the description relative to the foregoing embodiment, the computation in the above-mentioned equations is executed by utilizing the equality of the impedances of the positive-phase circuit and the negative-phase circuit. However, it is a matter of course that such computation may be carried out on the basis that the two impedances are not equal to each other.

As described hereinabove, according to the present invention which is so constituted as to compute the impedance up to the fault point from the circuit constants of the power transmission system and the information including the currents and voltages in both a normal state and a faulty state of the system, remarkable advantages are attainable in accomplishing a high-reliability short-circuit distance relay capable of substantially eliminating any error induced in the distance measurement by the resistance at the fault point.

What is claimed is:

1. In a short-circuit distance relay for protecting a single-channel power transmission system with a transmission line of length L and local and remote power supplies installed at the respective two ends of the transmission line, the improvement comprising:

first and second deriving means for respectively deriving values of a positive-phase voltage (V) and a positive-phase current (IL) at the location of said relay at the local end of the transmission line during a normal state of the system;

third, fourth and fifth deriving means for respectively deriving values of a positive-phase voltage (VF), a positive-phase current (IF) and a negative-phase current (I2) at the location of said relay during a fault state of the system;

a first memory circuit with selector switch means operated in response to detection of a fault for storing the derived value of the positive phase voltage (V) during a normal state of the system and for storing the derived value of the positive phase voltage (VF) during a fault state of the system;

a second memory circuit with selector switch means operated in response to detection of a fault for storing the derived value of a positive phase current (IL) during a normal state of the system and for storing the derived value of a positive phase current (IF) during a fault state of the system; and arithmetic and computation means for obtaining the fault impedance (XZ1) between the location of the relay and the point of fault in accordance with the following formula:

$$XZ1 = \frac{I2 \cdot (VF - V) + I2 \cdot (IF - IL) \cdot (ZP + ZQ) - (IF - IL)^2 \cdot (LZ2 + ZQ2)}{(IF - IL) \cdot (I2 - IF + IL)}$$

where:
(ZP+ZQ) is a sum of predetermined positive phase impedance of the system,
LZ2 is a predetermined negative phase impedance of the power transmission line, and
ZQ2 is a predetermined negative phase impedance behind the remote end.

* * * * *

UNITED STATES PATENT AND TRADEMARK OFFICE
CERTIFICATE OF CORRECTION

PATENT NO. : 4,755,903
DATED : July 5, 1988
INVENTOR(S) : Genzaburou Kotani

It is certified that error appears in the above-identified patent and that said Letters Patent is hereby corrected as shown below:

Column 3, line 2, "12" should be --I2--;

line 4, "12" should be --I2--;

line 63, the numeral "4" should be --9--.

Signed and Sealed this

Thirty-first Day of January, 1989

Attest:

DONALD J. QUIGG

*Attesting Officer*   *Commissioner of Patents and Trademarks*